United States Patent [19]
Galani et al.

[11] Patent Number: 6,005,446
[45] Date of Patent: Dec. 21, 1999

[54] MICROWAVE FREQUENCY SYNTHESIZER

[75] Inventors: Zvi Galani, Bedford; James T. Hanson, Maynard, both of Mass.

[73] Assignee: Raytheon Company, Lexington, Mass.

[21] Appl. No.: 08/942,712

[22] Filed: Oct. 1, 1997

[51] Int. Cl.$^6$ .................................................. H03B 21/02
[52] U.S. Cl. ................... 331/41; 331/2; 331/1 R; 331/37; 331/176; 455/76; 455/260; 327/105
[58] Field of Search .................................. 331/2, 16, 14, 331/40, 47, 53, 176, 37, 1 R, 41; 327/105; 455/260, 183.1, 76, 165.1

[56] References Cited

U.S. PATENT DOCUMENTS 5,032,800  7/1991  Galani et al. ........................... 331/1 R

OTHER PUBLICATIONS

Flory, C.A. and Taber, R.C., "High Performance Distributed Bragg Reflector Microwave Resonator", *Proc. 1996 IEEE International Frequency Control Symposium*, pp. 790–798.

Woode, R.A., et al., "An Ultra–Low Noise Microwave Oscillator Based on a High–Q Liquid Nitrogen Cooled Sapphire Resonator", *Proc. 1995 IEEE International Frequency Control Symposium*, pop. 420–426.

Cavin, M.S. and Almar, R.C., "An Oscillator Design Using Low g–Sensitivity, Low Phase Noise STW Devices," *Proc. 1995 IEEE International Frequency Control Symposium*, pp. 476–485.

Taber, R.C. and Flory, C.A., "Microwave Oscillators Incorporating Cryogenic Sapphire Dielectric Resonators", *IEEE Transactions on Ultrasonics, Ferroelectrics and Frequency Control*, 42(1): 111–119 (Jan. 1995).

Tobar, M.E., et al., "Low Noise Microwave Oscillators Based on High–Q Temperature Stabilized Sapphire Resonators", *Proc. 1994 IEEE International Symposium on Frequency Control*, pp. 433–440.

Montress, G. and Parker, T., "Design and Performance of an Extremely Low Noise Surface Acoustic Wave Oscillator," *Proc. 1994 IEEE International Symposium on Frequency Control*, pp. 1–9.

Shen, Z–y, et al., "High $T_c$ Superconductor and III–V Solid State Microwave Hybrid Circuits," *IEEE Transactions on Applied Superconductivity*, 3(1): 2832–2835 (Mar. 1993).

Wilker, C., et al., "A Sapphire Resonator for Microwave Characterization of Superconducting Thin Films," Du Pont Experimental Station, Wilmington, DE 19880–0304, manuscript received Aug. 24, 1992, pp. 1–4.

Driscoll, M., et al., "Cooled Ultrahigh Q, Sapphire Dielectric Resonators for Low–Noise, Microwave Signal Generation," *IEEE Transactions on Ultrasonics, Ferroelectrics, and Frequency Control*, 39(3): 405–411 (May 1992).

(List continued on next page.)

*Primary Examiner*—Arnold Kinkead
*Attorney, Agent, or Firm*—Hamilton, Brook, Smith & Reynolds, P.C.

[57] ABSTRACT

An apparatus and method for synthesizing low-noise, high stability, multi-frequency microwave signals is disclosed. The output frequencies of a lower frequency, low-noise, synthesizer are upconverted to higher microwave frequencies by mixing these frequencies with the output frequency of an ultra low noise microwave oscillator, determined by a very high Q resonator. Such resonators exhibit large frequency dependence on temperature, but the frequency of an ultra low noise microwave oscillator cannot be stabilized by phase-lock to a stable reference because of its very narrow voltage-controlled frequency tuning range, caused by the very high Q of the resonator. The microwave synthesizer output frequency stabilization is achieved by a novel phase-lock loop which uses the frequency tunability of a low noise SAW oscillator to compensate for the frequency drift of the microwave oscillator. The system does not require the very precise temperature control of a high Q resonator that otherwise would be needed to control the output frequency of a microwave synthesizer.

9 Claims, 5 Drawing Sheets

OTHER PUBLICATIONS

Driscoll, M.M. and Weinert, R.W., "Low Noise Microwave Signal Generation Using Cryogenic Sapphire Dielectric Resonators: An Update", *Proc. 1992 IEEE International Frequency Control Symposium*, pp. 157–161.

Zaki, K. and Xiao–Peng, L., "Higher Order Modes, High Q Dielectric Resonators for Oscillator Applications," *IEEE Frequency Control Symposium*, 1992, pp. 163–166.

Montress, G.K. and Parker, T.E., "Design Techniques for Achieving State–of–the–Art Oscillator Performance," *Proc. 1990 IEEE International Frequency Control Symposium*, pp. 522–535.

Montress, G., et al., "Residual Phase Noise Measurements of VHF, UHF, and Microwave Components," *43rd Annual Symposium on Frequency Control*, 1989, pp. 1–11.

Giles, A., et al., "A High Stability Microwave Oscillator Based on a Sapphire Loaded Superconducting Cavity," *43rd Annual Symposium on Frequency Control*, 1989, pp. 89–93.

MICROWAVE FREQUENCY SYNTHESIZER

BACKGROUND OF THE INVENTION

The continuing increase in sophistication of radars and communication systems has created the need for very low noise microwave frequency synthesizers for local oscillator and exciter applications.

The present state-of-the-art in low noise frequency synthesis is dominated by direct analog synthesizers. This architecture is based on frequency addition, subtraction, multiplication and division. Components used in direct analog synthesizers are low-noise oscillators, high stability accurate reference oscillators, amplifiers, frequency multipliers, frequency dividers, mixers, filters and switches. In a mathematical description of direct analog synthesis, mixing is represented by frequency addition or subtraction while generation of harmonic and subharmonic frequencies is represented by multiplication and division, respectively. Closed loop techniques (such as phase-lock or frequency-lock loops) are used in direct analog synthesizers to perform the ancillary functions of frequency synchronization and/or frequency stabilization.

One of the disadvantages of direct analog synthesis is that the low-noise oscillators such as surface acoustic wave (SAW) oscillators[1], surface transverse wave (STW) oscillators[2] and crystal oscillators operate at lower frequencies. Specifically, the highest output frequency of low noise crystal oscillators is approximately 100 MHz and the highest output frequency of low-noise SAW and STW oscillators is approximately 1000 MHz. Thus, either frequency multiplication, frequency upconversion or a combination of both are needed for direct analog synthesis of microwave frequencies. In frequency multiplication the phase noise of a low-noise oscillator is degraded by 20·log(N)dB where N is the frequency multiplication factor. In frequency upconversion, the output frequencies of a lower frequency direct analog synthesizer are upconverted to microwave frequencies by mixing the frequencies of the direct analog synthesizer with the output frequency of a low-noise microwave oscillator or the output frequency of a low-noise lower frequency oscillator followed by a frequency multiplier. Two examples are presented to illustrate the phase noise performance of prior art microwave direct analog synthesizers.

A prior art X-Band direct analog synthesizer 10 is shown in FIG. 1. It consists of a set of four SAW oscillators F1–F4 that are selected either one or two or three at a time by the switch matrix 12 to synthesize 64 equally spaced output frequencies. The frequencies F1, F2, F3, F4 of the SAW oscillators are equally spaced, the spacing being equal to the output frequency spacing $F_S$ of the synthesizer. This relationship is expressed as $$F4-F3=F3-F2=F2-F1=F_S \quad (1)$$

All the oscillators must be energized if short frequency switching and settling times are required. The output signal of one selected oscillator is amplified by amplifier 14 and connected to the input of a times-four frequency multiplier 16 the output of which is connected to the first mixer 18. The second signal to this mixer 18 is the direct output of another (or the same) selected oscillator after amplification in amplifier 15. The output signal from mixer 18 is filtered by band-pass filter 20 to yield the sum of these two frequencies. This sum frequency signal is applied to the input of amplifier 22 followed by the second mixer 24 where its frequency is added to the 16th harmonic of the frequency of another (or the same) oscillator selected by switch matrix 12 and amplified in amplifier 26, and multiplied times sixteen by frequency multiplier 28, and amplified in amplifier 30. The sum frequency signal at the output of mixer 24 is filtered by the second band-pass filter 32 and amplified by amplifier 34. This is the output signal $F_o$ of the synthesizer 10.

As shown in the diagram of FIG. 1, all the SAW oscillators F1–F4 are phase-locked by separate narrow band phase-locked loops (PLLs), with a loop bandwidth of approximately 100 Hz, to frequency $F_S$ derived from frequency $F_R$ of the reference oscillator 36 divided by an integer K. The purpose of the PLLs is to accurately control the absolute frequency of each SAW oscillator without affecting its phase noise to ensure that all the oscillators operate at frequencies that are integer multiples of frequency $F_S$, which is equal to the output frequency spacing of the synthesizer. Phase locking each oscillator to a common frequency is necessary in order to minimize generation of spurious frequencies in the synthesizer and to control the absolute accuracy of each output frequency of the synthesizer. The frequency of each SAW oscillator must therefore be selected to be an integer multiple of frequency $F_S$. The signal at frequency $F_S$ is fed to the PLL blocks associated with each of the SAW oscillators. Each PLL includes a phase detector which has the frequency $F_S$ as one of its input signals. The other input signal to each of the PLL phase detectors is derived by dividing the frequency of the corresponding SAW oscillator by an integer chosen to make the output frequency of the divider equal to $F_S$. The phase detector output signal of each PLL is fed to the frequency tuning port of the corresponding SAW oscillator through appropriate loop amplification and filtering. To ensure that the PLLs do not lose lock as a result of SAW oscillator frequency drift over temperature, the temperature of each SAW oscillator is controlled to reduce its frequency drift to a value that is less than its frequency tuning range. SAW oscillator frequency also drifts over time due to aging of components but this drift is typically much smaller than the drift over temperature and will not be considered in this discussion.

If the frequencies of the four SAW oscillators are $F_i$ (i=1,2,3,4) then the output frequency $F_o$ of this synthesizer is given by:

$$F_o=Fi+4Fj+16Fk \quad i,j,k=1,2,3,4 \quad (2)$$

Assuming that the phase noise levels of all the SAW oscillators are identical, the highest phase noise at the output of the synthesizer occurs when i=j=k. Under this condition $$F_o=Fi+4Fi+16Fi=21Fi \quad (3)$$

meaning that the output frequency is the 21st harmonic of the selected SAW oscillator frequency and that the cumulative phase noise at the output of the synthesizer is the phase noise of the SAW oscillator increased by 20·log(21) dB, which is equal to 26.4 dB. Other synthesizer components may degrade this noise further.

Consider, for example, a synthesizer with 64 X-band frequencies spaced by 10 MHz, from 9870 MHz to 10500 MHz. This would require SAW oscillator frequencies of 470, 480, 490 and 500 MHz. Since the phase noise of a very low noise 500 MHz SAW oscillator is −167 dBc/Hz at 10 kHz offset from the carrier, an increase of 26.4 dB yields phase noise of −140.6 dBc/Hz. Because of all other noise contributors (amplifiers, mixers, switches, etc.) the predicted phase noise at the output of this microwave synthesizer is typically −139.6 dBc/Hz at 10 kHz offset from the carrier.

Another prior art direct analog synthesizer topology is shown in FIG. 2 wherein like components to those in FIG.

1 will not be further described (for simplification) and are designated by the same reference numeral with a zero suffix. In this topology the L-band output frequency of a direct analog synthesizer 100 (similar to the one in FIG. 1), capable of generating 16 frequencies (e.g. 1450 MHz to 1600 MHz, spaced by 10 MHz), is mixed with a microwave frequency $F_M$ (e.g. 8.5 GHz) of a low-noise microwave oscillator 400, in this example a dielectric resonator oscillator (DRO). The key components of the DRO are a low phase noise microwave amplifier, a dielectric resonator and a voltage-tuned phase shifter for the DRO's frequency tuning. The output frequency (9950 MHz to 10100 MHz, spaced by 10 MHz) which is the sum of both the L-band synthesizer and the DRO frequencies, is filtered by the band-pass filter 320 and the output signal $F_o$ is amplified by the output amplifier 340. Similarly to FIG. 1, the frequencies of the 4 SAW oscillators and of the DRO are stabilized by phase locking each oscillator to a high stability reference oscillator 420 (e.g. a crystal or other high stability oscillator). As in FIG. 1, the design (including temperature control)of all the oscillators must be controlled to ensure that the frequency drift with temperature and aging effects of each oscillator do not exceed the voltage-controlled frequency tuning range of each oscillator.

Assuming that the 8.5 GHz dielectric resonator in oscillator 400 is made of Barium Tetratitanate, its unloaded Q ($Q_U$) is approximately 5000 which results in 3 dB bandwidth of 3.4 MHz when critically coupled to the oscillator circuit. This provides a useful voltage-controlled frequency tuning range on the order of ±850 kHz. Since resonators of this type are available with numerous values of frequency/ temperature relationships, an average value of 2 ppm/° C. (or 17 kHz/° C.) is arbitrarily selected for this example. For an operating temperature range of 100° C. the DRO frequency drift is 1.7 MHz without frequency stabilization. Therefore, if a PLL is used for DRO frequency stabilization and a linear frequency versus temperature relationship is assumed over the operating temperature range, the temperature range of the DRO must be reduced to less than 50° C. to ensure that the PLL does not lose lock. This 50° C. range requires very simple temperature control.

However, the advantage of wide oscillator frequency tuning range provided by low Q resonators is offset by the disadvantage of relatively poor phase noise performance. The predicted phase noise of this DRO is approximately −115 dBc/Hz at 10 kHz offset from the carrier, caused primarily by the low $Q_U$ (5000) of the resonator. Since the predicted phase noise of the L-band direct analog synthesizer 100 is −152 dBc/Hz at 10 kHz offset from the carrier, the predicted cumulative phase noise of the microwave synthesizer is limited by the phase noise of the DRO to −115 dBc/Hz at 10 kHz offset from the carrier.

The phase noise of the microwave synthesizer topology in FIG. 2 can be reduced significantly by use of ultra low noise microwave oscillators incorporating very high Q microwave resonators and very low phase noise microwave amplifiers (amplifiers with phase noise of −160 dBc/Hz or lower at 10 kHz offset from the carrier). Examples of very high Q resonators include sapphire "whispering gallery" resonators [3], sapphire disc resonators in enclosures lined with high temperature superconducting (HTS) films [4], and Distributed Bragg Reflector resonators [5]. The measured $Q_U$ of X-band whispering gallery resonators is 200,000 at room temperature (300 K) and 20,000,000 at 77 K (with cryogenic cooling). The $Q_U$ of an X-band sapphire disc resonator in an enclosure lined with HTS films is 300,000 at 77 K and the $Q_U$ of an X-band Distributed Bragg Reflector resonator is approximately 600,000 at 300 K. As an example, the predicted phase noise of a 10 GHz whispering gallery resonator oscillator at 10 kHz offset from the carrier can be as low as −142 dBc/Hz at 300 K and −159 dBc/Hz at 77 K. Close to the carrier phase noise of these oscillators can be reduced significantly with frequency-locked noise degeneration loops [6]. However, these loops do not impact the problem solved by this invention.

Many very high Q resonators exhibit a large frequency dependence on temperature. For example, the reported frequency variation of a 10 GHz sapphire whispering gallery resonator is 70 ppm/K [7] or 700 kHz/K at 300 K and 11.5 ppm/K [8] or 115 kHz/K at 77 K. The frequencies of oscillators using very high Q resonators cannot be stabilized by phase-locking to stable reference oscillators because the high Q values of the resonators result in oscillator voltage-controlled frequency tuning ranges that are much smaller than the frequency drift of the respective resonators over temperature. For example, for an X-band whispering gallery resonator $Q_U$ values of 200,000 at 300 K and 20,000,000 at 77 K, the 3 dB bandwidths are 100 kHz and 1 kHz, respectively, when critically coupled to the oscillator circuit. Under the condition of critical coupling, the loaded Q ($Q_L$) of the resonator is equal to $Q_U/2$. Since the effective voltage-controlled frequency tuning range of an oscillator can be realized over approximately 50% of the resonator's 3 dB bandwidth, the tuning range of the oscillator is ±25 kHz at 300 K and ±250 Hz at 77 K. Consequently, to phase-lock a whispering gallery resonator oscillator to a stable reference, the temperature range of the resonator must be reduced with temperature control not to exceed 0.035K at 300 K and 0.002K at 77 K. Such stringent temperature control requirements are impractical in most frequency synthesis applications.

A need exists, therefore, for a more practical ultra low noise microwave oscillator frequency stabilization method to facilitate the use of these oscillators in ultra low noise microwave synthesizers.

SUMMARY OF THE INVENTION

In accordance with the invention, a system is provided in which an ultra low noise microwave oscillator is combined with one or more low noise voltage tuned SAW oscillators and a high stability reference oscillator in a unique phase-lock loop frequency control configuration to produce one or more stabilized ultra low noise microwave output frequencies. The ultra low noise microwave oscillator frequency stabilization method of the invention does not require the extremely precise temperature control that would be needed if this oscillator were phase-locked directly to a stable reference. The frequency stability of a stable reference is achieved with a novel phase-lock loop that makes use of the frequency tunability of a low noise SAW oscillator to compensate for the microwave oscillator frequency drift. The system can operate with or without frequency multiplication of the SAW oscillator frequency. The lowest phase noise is achieved at one or N frequencies when the frequency of either one SAW oscillator or one selected from a bank of N SAW oscillators, respectively, is mixed with the frequency of the ultra low noise microwave oscillator.

DETAILED DESCRIPTION OF THE INVENTION

Figure 3:
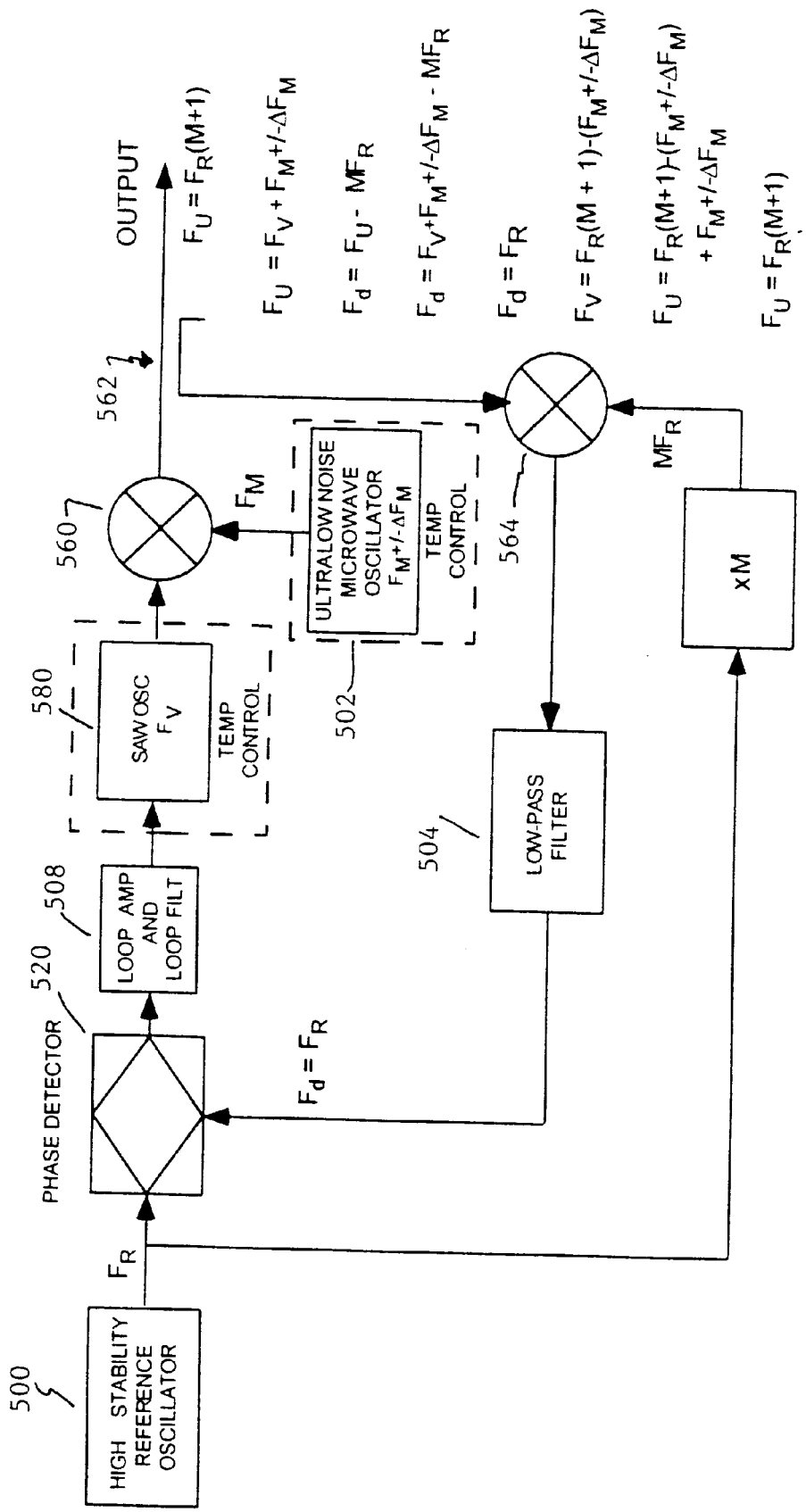
FIG. 3 is a block diagram of a frequency stabilized ultra low noise microwave source of the invention.
Figure 4:
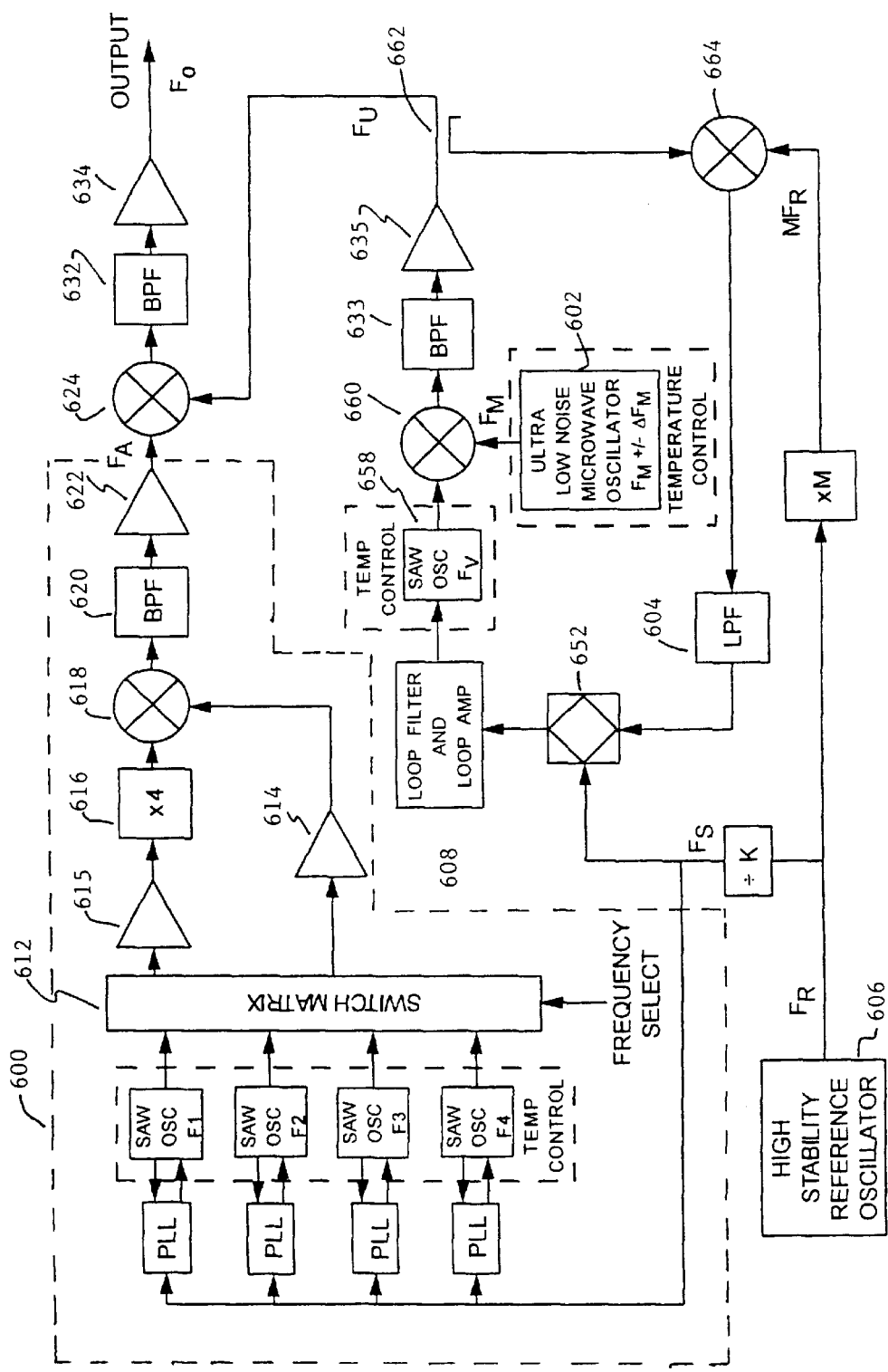
FIG. 4 is a block diagram of an example of an ultra low noise microwave synthesizer of the invention.
Figure 5:
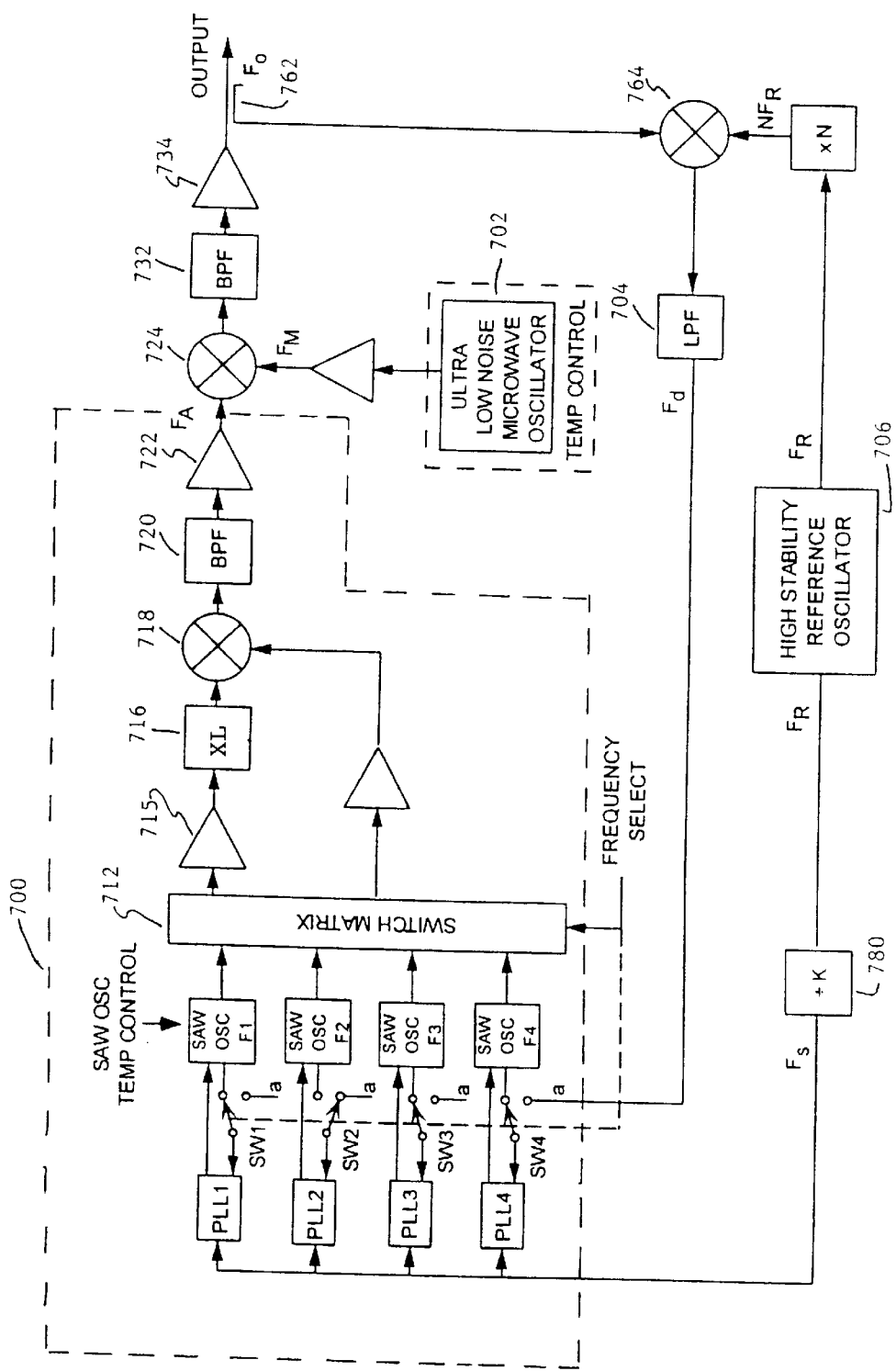
FIG. 5 is a block diagram of an example of an alternate embodiment of an ultra low noise microwave synthesizer of the invention.

A novel approach to ultra low noise microwave oscillator frequency stabilization is shown in the block diagram of FIG. 3. The principles involved in the implementation of this frequency stabilization method are used in high stability, ultra low noise microwave synthesizers, examples of which are shown in FIGS. 4 and 5.

In the system shown in FIG. 3, an ultra low noise microwave oscillator 502 which includes a very low phase noise microwave amplifier and a very high Q resonator (e.g. a whispering gallery resonator) (not shown) as its preferred components, generates an output frequency $F_M \pm \Delta F_M$ (where $\Delta F_M$ is the oscillator's frequency drift) which is mixed in mixer 560 with the output frequency $F_V \pm \Delta F_V$ of a high quality voltage tunable UHF SAW oscillator 580 (where $\Delta F_V$ is the SAW oscillator's frequency drift) to produce an output frequency $F_U$ which is equal to the sum (or difference) of the two frequencies. Since $\Delta F_V$ is much smaller than $\Delta F_M$ and can be reduced to an insignificant value with relatively simple temperature control, $\Delta F_V$ has not been included in the description of this invention. Therefore, $$F_U = F_M \pm \Delta F_M + F_V \quad (4)$$

A portion of the output signal at frequency $F_U$ is coupled by coupler 562 to mixer 564 where it is mixed with the M-th harmonic of a high stability reference oscillator frequency, $MF_R$, to produce a difference frequency signal with frequency $F_d$ where $$F_d = F_U - MF_R \quad (5)$$

Following the low-pass filter 504, this difference frequency $F_d$ is fed to one input port of the phase detector 520 while the reference frequency $F_R$ from reference oscillator 500 is connected to the other input port. The output signal of the phase detector 520 is amplified and filtered in the loop amplifier and filter 508, and is connected to the frequency tuning port of the SAW oscillator 580. The PLL feedback action tunes the SAW oscillator frequency to compensate for the frequency drift of the microwave oscillator as well as its own frequency drift, thus forcing the difference frequency $F_d$ to be equal to $F_R$. Under these conditions the loop is locked and stabilized, and substitution of (4) into (5) yields $$F_d = F_M \pm \Delta F_M + F_V - MF_R = F_R \quad (6)$$

Equation (6) is rearranged below to solve for the SAW oscillator frequency under closed loop conditions.

$$F_V = F_R(M+1) - (F_M \pm \Delta F_M) \quad (7)$$

Substitution of (7) into (4) yields the output frequency of the frequency stabilized ultra low noise microwave source to be $$F_U = F_R(M+1) \quad (8)$$

From (8) it is evident that the output frequency $F_U$ depends only on the high stability reference frequency $F_R$ and not on the frequencies of the SAW oscillator and the ultra low noise microwave oscillator. In essence, the system described in FIG. 3 uses the frequency tuning capability of the SAW oscillator 580 to compensate for the residual frequency errors of the SAW oscillator and the ultra low noise microwave oscillator and its output frequency stability is determined by the frequency stability of the reference oscillator 500.

It should be noted that the PLL can stay locked only if the combined frequency drift of the SAW oscillator 580 and the ultra low noise microwave oscillator 502 is less than the voltage-controlled frequency tuning range of the SAW oscillator 580.

As an example, the frequency $F_M$ of the microwave oscillator is 8 GHz and the nominal frequency of the SAW oscillator is 500 MHz with a voltage-controlled frequency tuning range of ±42 ppm which translates to approximately ±21 kHz. If the frequency drift of the temperature controlled SAW oscillator is not considered because of its very small value relative to the temperature related frequency drift of the microwave oscillator, then the temperature of the microwave oscillator must be controlled to limit its frequency drift to less than ±21 kHz.

Figure 2:
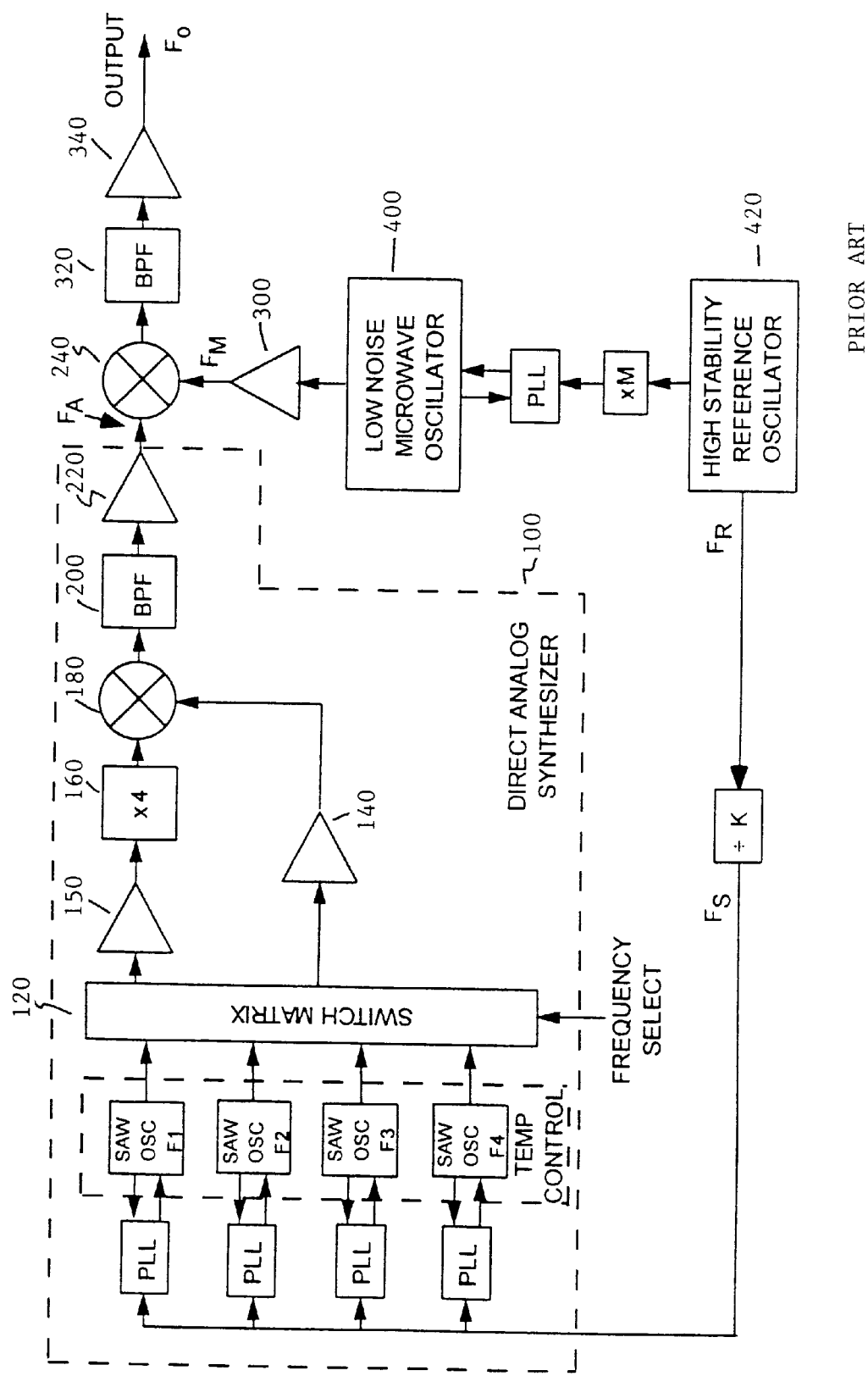
FIG. 2 is a block diagram of an example of a prior art X-band synthesizer based on direct analog synthesis and frequency upconversion.

It was previously stated that the reported frequency variation of an X-band whispering gallery resonator is 70 ppm/K or 700 kHz/K at room temperature (300 K) and 11.5 ppm/K or 115 kHz/K at 77 K. This implies that the temperature range of the microwave oscillator must be reduced to less than 0.03K for a resonator at 300 K and to less than 0.18K for a resonator cooled to 77 K to ensure that the PLL does not lose lock. As previously stated, stabilization of the microwave oscillator frequency with a conventional PLL (similar to FIG. 2) would require temperature control to less than 0.035K at 300 K and 0.002K at 77 K. The very precise temperature control required at 77 K is a result of the very high $Q_U$ of the resonator (20,000,000) which limits the voltage-controlled frequency tuning range to ±250 Hz. For comparison, stabilization of the microwave oscillator frequency to 0.01 ppm/K (stability of a precision reference oscillator) with temperature control only (without the invention) would require an unrealistic temperature range reduction to 0.00014K at 300 K and 0.00087K at 77 K.

With a whispering gallery resonator in the microwave oscillator, the predicted phase noise of the ultra low noise microwave source in FIG. 3 is −142 dBc/Hz at 300K and −158 dBc/Hz at 77K, both at 10 kHz offset from the carrier.

There are several ways in which these ideas can be incorporated into a high stability, ultra low noise, microwave frequency synthesizer. One possible technique is shown in FIG. 4. In this implementation, the ultra low noise frequency stabilized microwave source 602 of FIG. 3 (with output frequency of e.g. 8.5 GHz) is used to upconvert the 16 output frequencies of a L-band direct analog synthesizer 600 (with output frequencies identical to the L-band frequencies in FIG. 2) to the 16 X-band frequencies of FIG. 2.

Figure 1:
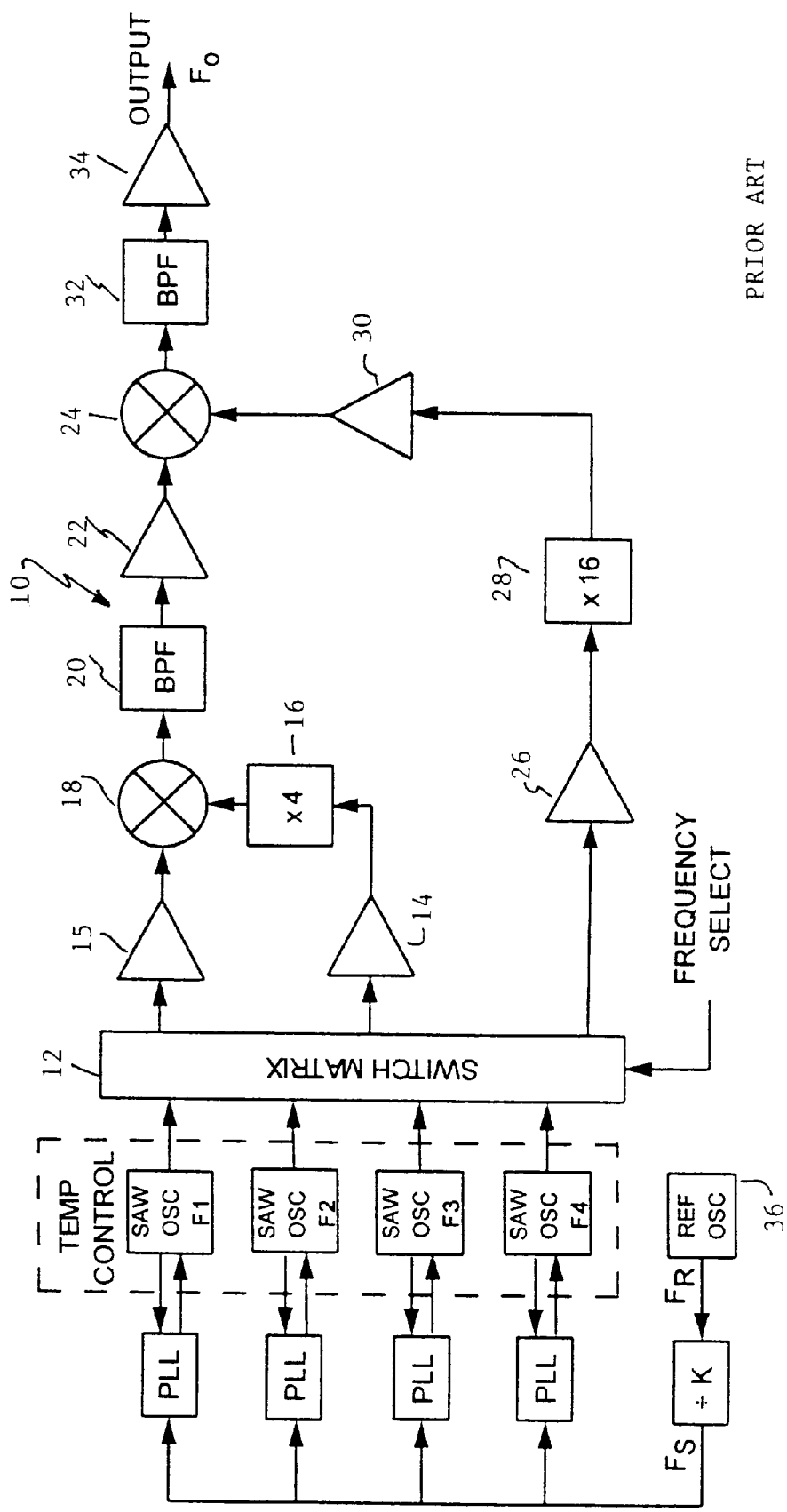
FIG. 1 is a block diagram of an example of a prior art X-Band direct analog synthesizer.

The operation of this synthesizer configuration can be explained with the help of FIG. 4. The topology of this 16-frequency L-band direct analog synthesizer is similar to the topology of the 64-frequency synthesizer of FIG. 1. Each of the SAW oscillators F1–F4 is phase-locked to a high stability reference oscillator 606 with a narrow band PLL exactly the same way that has been previously described. In this way, the absolute frequency of each of the SAW oscillators is determined by the reference oscillator 606 while the phase noise performance of this portion of the synthesizer is determined by the SAW oscillators F1–F4. As was previously described, this is typically −167 dBc/Hz+

20·log(5)=−153 dBc/Hz at 10 kHz offset from the carrier. The phase noise contributions of all the other synthesizer components increase this phase noise to −152 dBc/Hz at 10 kHz from the carrier. If the SAW oscillators are operating at frequencies F1, F2, F3 and F4 then the frequency dividers in the corresponding PLLs have division ratios of K1, K2, K3 and K4. The output frequency $F_A$ of the L-band synthesizer (after the first mixer) is given by $$F_A = F_S(4K_m + K_n) \quad m,n=1,2,3,4 \tag{9}$$

where $$F_S = F_R/K \tag{10}$$

and $F_S$ and $F_R$ are the L-band synthesizer output frequency spacing and the reference oscillator frequency, respectively.

The frequency stabilized ultra low noise microwave source portion of the microwave synthesizer operates in exactly the same manner as described in FIG. 3 with the microwave oscillator frequency error being removed by the voltage tuned SAW oscillator frequency $F_V$. Similarly to FIG. 3 the frequency stabilized ultra low noise microwave source output frequency $F_U$ is given by $$F_U = F_R(M+1) \tag{11}$$

where M is the reference frequency multiplication factor.

The output frequency $F_O$ of the microwave synthesizer is generated in the output mixer and, after filtering, is given by the sum of output frequencies of the L-band synthesizer 600 ($F_A$) and the frequency stabilized ultra low noise microwave source ($F_U$), as follows:

$$F_O = F_A + F_U \tag{12}$$

Substitution of (9), (10) and (11) into (12) yields $$F_O = (F_R/K)(4K_m + K_n + KM + K) \quad m,n=1,2,3,4 \tag{13}$$

Notice that just as was the case for the frequency stabilized ultra low noise microwave source of FIG. 3, the frequency error term of the ultra low noise microwave oscillator 602 does not appear in the output frequency. The output frequency depends only on the high stability reference frequency $F_R$. If a whispering gallery resonator is used in the ultra low noise microwave oscillator 602, the predicted phase noise of this microwave synthesizer is −141 dBc/Hz at 300 K and −151 dBc/Hz at 77 K, both at 10 kHz offset from the carrier.

An alternate ultra low noise microwave frequency synthesizer in which one selected SAW oscillator of the L-band synthesizer performs the dual function of frequency synthesis and microwave oscillator frequency correction is shown in FIG. 5. This synthesizer has the advantage of requiring one less SAW oscillator and one less mixer than the synthesizer in FIG. 4. The L-band synthesizer 700 in FIG. 5 generates the same 16 L-band frequencies as in FIGS. 2 and 4. The ultra low noise microwave oscillator 702 frequency is 8.5 GHz and the microwave synthesizer output frequencies are identical to the output frequencies $F_o$ in FIGS. 2 and 4.

The key to proper operation of this microwave synthesizer are the selector switches SW1 through SW4 at the inputs of PLL1 through PLL4, respectively. Each switch can select either the respective SAW oscillator output frequency $F_1$–$F_4$ for phase locking of that SAW oscillator to the stable frequency $F_S$ or the difference frequency $F_d$ from LPF 704 which includes the frequency errors of the ultra low noise microwave oscillator and of that SAW oscillator. Frequency $F_d$ can be selected only by one switch at a time. Under these conditions the microwave synthesizer frequency correction loop acts exactly the same as in the frequency stabilized ultra low noise microwave source in FIG. 3 and the other SAW oscillators act the same as the SAW oscillators of the L-band synthesizers in FIGS. 2 and 4.

In the diagram of FIG. 5 the SAW oscillator F2 with frequency F2 is selected by the switch matrix 712 for L-band frequency synthesis and by switch SW2 for microwave synthesizer frequency correction loop. One of the other SAW oscillators is also selected by the switch matrix 712 for L-band frequency synthesis.

The action of the microwave synthesizer frequency correction loop may be described as follows. The SAW oscillator with frequency F2, selected by SW2 for the microwave synthesizer frequency correction loop, is also selected by the switch matrix 712 as the oscillator which has its output frequency multiplied times 4 in unit 716 to produce a signal in the frequency range of 1.6 GHz. This frequency is mixed with frequency F1 from the other selected SAW oscillator F1 to generate the L-band frequency $F_A$ which is given by $$F_A = F1 + 4F2 \tag{14}$$

After filtering in filter 720 and amplification in amplifier 722 frequency $F_A$ is mixed in mixer 724 with frequency $F_M \pm \Delta F_M$ of the ultra low noise microwave oscillator 702 to produce the output frequency of the microwave synthesizer $F_O$, given by $$F_O = F_A + F_M \pm \Delta F_M \tag{15}$$

The SAW oscillator with frequency F1 is phase locked to the stable frequency $F_S$ via the phase-lock loop PLL1 which contains a frequency divider that divides F1 by K1. PLL1 action forces F1 to be $$F1 = F_S \cdot K1 \tag{16}$$

Substitution of (14) and (16) into (15) yields the output frequency $F_O$ of the microwave synthesizer to be $$F_O = F_S \cdot K1 + 4F2 + F_M \pm \Delta F_M \tag{17}$$

A sample of the output signal at frequency $F_O$ is coupled by coupler 762 and heterodyned with the N-th harmonic of the high stability reference oscillator 706, frequency $F_R$. The resultant difference frequency $F_d$ is selected by the low pass filter 704 and fed to PLL2 via switch SW2 where it is divided by the integer K2. The feedback action of the frequency correction loop tunes the SAW oscillator frequency F2 to a value which yields $$F_d/K2 = F_S = F_R/K \tag{18}$$

The difference frequency $F_d$ is given by $$F_d = F_O - NF_R \tag{19}$$

Substitution of (17) and (18) into (19) yields after rearrangement of terms $$4F2 = (K2/K)F_R - F_S K1 - F_M - (\pm \Delta F_M) \tag{20}$$

The output frequency $F_O$ of the microwave synthesizer is obtained after substitution of (20) into (17)

$$F_O = [(K2/K) + N]F_R \tag{21}$$

From (21) it is evident that $F_O$ does not include the frequency error of the ultra low noise microwave oscillator and depends only on $F_R$, the frequency of the high stability reference oscillator 706.

With a whispering gallery resonator at 77 K in the ultra low noise microwave oscillator, the predicted phase noise of this synthesizer is −151 dBc/Hz at 10 kHz offset from the carrier.

Although SAW oscillators, whispering gallery resonator oscillators and direct analog synthesizers of a particular topology were used in the examples, the concepts of this invention are not limited to these particular components, topologies and architectures. They can be applied to other present or future oscillator circuits and synthesizer architectures.

This invention provides a novel high stability, ultra low noise frequency synthesis concept suitable for use in state-of-the-art radar, missile and communications systems. The novelty of the invention allows the use of ultra low noise microwave oscillators as key elements in the design without complex temperature control systems that otherwise would be required. These temperature control systems would make the oscillators impractical for many applications, particularly where volume and power are limited. The invention solves the fundamental problems of frequency stabilization of ultra low noise microwave oscillators which exhibit poor frequency stability over environmental conditions (in particular temperature) but cannot be phase-locked to stable reference frequencies because of very narrow frequency tuning ranges. The invention makes possible the design of synthesizers that exhibit ultra low phase noise and frequency stability over temperature as well as long term stability characteristics of the best low frequency reference oscillators available.

Note that by "microwave frequency signals" is meant electronic signals preferably having a frequency of at least 1 GHz. Also, by "ultra low noise" or low phase noise is meant −140 dBc/Hz or less at 10 kHz offset from carrier at X-band frequencies. By "high frequency stability" oscillator is meant unlimited frequency stability which can be as high or even better (in the future) than the frequency stability of atomic oscillators.

We claim:

1. In combination:
   a. a plurality of low noise voltage tuned oscillators for providing a plurality of tuneable frequency signals;
   b. switch means for selecting one or more of said plurality of tuneable frequency signals;
   c. a low noise microwave oscillator for generating a microwave signal;
   d. a first mixer for mixing the said one or more tuneable frequency signals with the microwave oscillator signal to provide one or more low noise microwave frequency signals;
   e. a stable reference oscillator coupled to said low noise voltage tuned oscillators; and
   f. a phase-lock frequency control loop between said first mixer and said reference oscillator to stabilize said one or more low noise microwave frequency signals and wherein the phase-lock frequency control loop comprises a second mixer to which is coupled a portion of a selected low noise microwave frequency signal for mixing with a multiple of a reference signal $F_R$ from said reference oscillator to produce a difference signal $F_d$, and a phase detector to which is coupled the signals $F_R$ and $F_d$.

2. A microwave frequency synthesizer comprising:
   a) A low phase noise microwave frequency signal generator including:
      i. a frequency stable reference oscillator for generating a reference oscillator signal $F_R$;
      ii. a phase detector having first and second input signals for generating at its output a difference frequency error signal proportional to the difference between the frequencies of the first and second input signals, and wherein the reference signal $F_R$ is the first of the two input signals;
      iii. a low noise microwave oscillator for generating a microwave signal $F_M$ which may vary in frequency between a range of $\pm\Delta F_M$;
      iv. a voltage tunable oscillator for generating a single frequency output signal $F_V$ which is controlled by the difference frequency error signal from said phase detector;
      v. a first mixer for mixing the single frequency output signal $F_V$ from the voltage tunable oscillator with the microwave signal $F_M$ to upconvert the single frequency output signal $F_V$ to a higher frequency microwave output signal $F_U$ which has low phase noise and high frequency stability; and
      vi. a coupler for coupling a portion of the output signal $F_U$ to a second mixer having two separate inputs, one of which is the signal portion $F_U$ and the other of which is a portion of the reference oscillator signal with frequency $F_R$ multiplied by a factor M, wherein M is an integer number selected to generate a frequency $MF_R$ high enough to produce a difference frequency signal $F_d = F_V + F_M \pm \Delta F_M - MF_R$, when mixed in said second mixer with the signal portion $F_U$, and wherein the difference frequency signal $F_d$ is the second of the inputs to said phase detector;
   b) a frequency synthesizer for generating one, $F_A$, of a plurality of output frequency signals, and wherein which one of the plurality of output signals is generated depends upon a switching signal from a frequency selector device; and
   c) a third mixer for mixing the signal portion $F_U$, and the one output signal $F_A$ of the frequency synthesizer selected by the selector device, to produce an output frequency $F_o$.

3. In a microwave frequency synthesizer; a single frequency synthesizer for generating a low noise microwave frequency signal comprising:
   a) a frequency stable reference oscillator for generating a reference frequency signal $F_R$;
   b) a phase detector having first and second inputs for generating at its output an error signal proportional to the difference between the frequencies of the signals at the first and second inputs, and wherein the reference signal $F_R$ is one of the first and second inputs;
   c) a low noise microwave oscillator for generating a microwave signal $F_M$ which may vary in frequency between a range of $\pm\Delta F_M$;
   d) a voltage tunable oscillator for generating a single frequency output signal $F_V$ which is controlled by the output error signal from said phase detector;
   e) a first mixer for mixing the single frequency output signal $F_V$ from the voltage tunable oscillator with the microwave signal $F_M$ to upconvert the single frequency output signal $F_V$ to a higher frequency microwave output signal $F_U$ which has low phase noise and high frequency stability; and
   f) a coupler for coupling a portion of the output signal $F_U$ to a second mixer having two separate inputs, one of which is the signal portion $F_U$ and the other of which is a portion of the reference oscillator signal with frequency $F_R$ multiplied by a factor M, wherein M is an integer number sufficient to generate a frequency $MF_R$ high enough to produce a difference frequency signal $F_d=F_U-MF_R$ when mixed in said second mixer with the signal portion $F_U$, and wherein the difference frequency signal $F_d$ is the second of the inputs to said phase detector.

4. A method of generating a low noise microwave frequency signal comprising the steps of:
   a) generating a reference oscillator signal $F_R$;
   b) generating an error signal proportional to the difference between the frequencies of the first and the second signals, and wherein the first signal is $F_R$;
   c) generating a microwave signal $F_M$ which may vary in frequency between a range of $\pm\Delta F_M$;
   d) generating a single frequency output signal $F_V$ which is controlled by said error signal;
   e) mixing the single frequency output signal $F_V$ with the microwave signal $F_M$ to upconvert the single frequency signal $F_V$ to a higher frequency microwave signal $F_U$ which has low phase noise and high frequency stability; and
   f) mixing a portion of the output signal $F_U$ with a portion of the reference oscillator signal with frequency $F_R$ multiplied by a factor M, wherein M is an integer number selected to generate a frequency $MF_R$ high enough to produce a difference frequency signal $F_d=F_U-MF_R$ when mixed with the signal portion $F_U$, and wherein the signal $F_d$ is the second signal of step (b).

5. The synthesizer of claim 2 wherein the frequency synthesizer is a direct analog synthesizer and the low noise microwave oscillator is selected from the group comprising whispering gallery resonators, sapphire disc resonators in enclosures lined with high temperature superconducting (HTS) films or distributed Bragg reflector resonators.

6. The method of claim 4 wherein the microwave signal is generated by a low noise microwave oscillator selected from the group comprising whispering gallery resonators, sapphire disk resonators in enclosures lined with high temperature superconducting (HTS) films or distributed Bragg reflector resonators.

7. The combination of claim 1 wherein the low noise microwave oscillator is selected from the group comprising whispering gallery resonators, sapphire disk resonators in enclosures lined with high temperature superconducting (HTS) films or distributed Bragg reflector resonators.

8. The combination of claim 1 wherein both the low noise microwave oscillator and the voltage tuned oscillators are temperature controlled.

9. A synthesizer comprising:
   a) a plurality of low noise voltage tuned oscillators having an input terminal and output terminal for providing a plurality of tuneable frequency output signals F1, F2, F3 ... FX;
   b) a switch matrix for selecting one or more of said tuneable frequency output signals;
   c) a frequency multiplier coupled to said matrix for multiplying a signal selected by the matrix by a constant M;
   d) a plurality of switches connecting, one switch at a time, the input of its respective PLL to either a portion of the output of the respective voltage tuned oscillator or difference frequency signal $F_d$;
   e) a first mixer for mixing one selected signal $F_i$ from said matrix with a second selected signal from said switch matrix which has been multiplied by said constant M to produce a frequency $F_A=F_i+MF_j$, where i, j=1, 2, 3, 4;
   f) a low noise microwave frequency source for generating a low noise microwave signal $F_M\pm\Delta F_M$;
   g) a second mixer for mixing the signal $F_A$ with the signal $F_M\pm\Delta F_M$ to produce an output frequency signal $F_O$ equal to $F_M\pm\Delta F_M\pm F_A$;
   h) a reference oscillator for producing a stable reference oscillator signal $F_R$ and an $N_{th}$ harmonic thereof;
   i) a third mixer for mixing a sample of the output signal $F_O$ with said $N_{th}$ harmonic to produce said difference signal $Fd=F_O-NF_R$;
   j) and wherein a frequency divider is coupled between said phase locked loops and said reference oscillator for producing a signal $F_S=F_R/K$, such that the output frequency of the synthesizer depends only upon the frequency $F_R$ of the reference oscillator.

* * * * *